United States Patent [19]
Sebald et al.

[11] Patent Number: 5,648,195
[45] Date of Patent: Jul. 15, 1997

[54] RADIATION-SENSITIVE RESIST COMPOSITION COMPRISING A DIAZOKETONE

[75] Inventors: Michael Sebald, Hessdorf; Siegfried Birkle, Höchstadt; Karin Preissner, Lauf; Hans-Jürgen Bestmann, Erlangen, all of Germany

[73] Assignee: Siemens Aktiengesellschaft, Munich, Germany

[21] Appl. No.: 571,879

[22] PCT Filed: Jun. 28, 1994

[86] PCT No.: PCT/DE94/00740

§ 371 Date: Jan. 5, 1996

§ 102(e) Date: Jan. 5, 1996

[87] PCT Pub. No.: WO95/02851

PCT Pub. Date: Jan. 26, 1995

[30] Foreign Application Priority Data

Jul. 12, 1993 [DE] Germany .................. 43 23 289.2

[51] Int. Cl.$^6$ .................. G03C 1/52; G03C 1/60; G03F 7/40
[52] U.S. Cl. .................. 430/170; 430/189; 430/191; 430/192; 430/270.1; 430/309; 430/328
[58] Field of Search .................. 430/270.1, 191, 430/189, 309, 328, 330, 176, 170, 192

[56] References Cited

U.S. PATENT DOCUMENTS

| | | | |
|---|---|---|---|
| 4,959,293 | 9/1990 | Schwartzkopf | 430/189 |
| 5,171,656 | 12/1992 | Sebald et al. | 430/189 |
| 5,262,283 | 11/1993 | Sezi et al. | 430/375 |
| 5,272,042 | 12/1993 | Allen | 430/270 |
| 5,273,856 | 12/1993 | Lyons | 430/191 |
| 5,340,682 | 8/1994 | Pawlowski et al. | 430/270.1 |
| 5,389,491 | 2/1995 | Tani et al. | 430/176 |
| 5,424,166 | 6/1995 | Pawlowski et al. | 430/176 |

FOREIGN PATENT DOCUMENTS

| | | |
|---|---|---|
| 0453610A1 | 10/1991 | European Pat. Off. . |
| 1300248 | 4/1989 | Japan . |

OTHER PUBLICATIONS

"Introduction to Microlithography", ACS Symposium Series 219, L.F. Thompson, C.G. Willson, M.J. Bowden, American Chemical Society, Washington, D.C. (1983).

"Semiconductor Lithography Principles, Practice, and Materials", Microdevices Physics and Fabrication Technologies, Wayne M. Moreau, Plenum Press, New York (1988).

"Advances in Resist Technology and Processing VT", vol. 1086, Proceedings, SPIE–The International Society for Optical Engineering Elsa Reichmanis, San Jose, CA. (27 Feb.–1 Mar. 1989).

"Encycl. Polym. Sci, Eng.", vol. 9 (1987), S.132.

*Primary Examiner*—John S. Chu
*Attorney, Agent, or Firm*—Kenyon & Kenyon

[57] ABSTRACT

A radiation-sensitive resist composition for manufacturing highly resolved relief structures is characterized by the following components:

- a film-forming base polymer;
- a radiation-active component that releases an acid when irradiated;
- a radiation-sensitive ester-former; and
- a solvent.

12 Claims, No Drawings

RADIATION-SENSITIVE RESIST COMPOSITION COMPRISING A DIAZOKETONE

BACKGROUND OF THE INVENTION

The invention relates to a radiation-sensitive resist composition, as well as to a method for manufacturing highly resolved relief structures.

In semiconductor production, highly resolving, radiation-sensitive resists are needed to produce fine patterns. In lithographic processes, a substrate is covered with a thin layer of this type of resist, and the desired pattern is transferred, initially as a latent image, into this layer—through projection exposure or beam control. If indicated, following further treatment steps, such as baking and silylation, the latent image is then developed, a relief pattern that serves as a mask for subsequent substrate etching processes being formed in the resist layer. The substrate can thereby consist of a semiconductor material such as silicon, or it can be a polymeric layer of organic material, i.e., one then has a so-called two-layer resist (c.f., e.g., L. F. Thompson, C. G. Willson, M. J. Bowden "Introduction to Microlithography", ACS Symposium Series 219, American Chemical Society, Washington 1983, pp. 16, 20 and 21; W. M. Moreau "Semiconductor Lithography", Plenum Press, New York 1988, page 4).

Besides a film-forming base polymer, a radiation-active compound constitutes the main component of the resist or of the resist layer. The radiation-active component, which is generally a diazo compound or a so-called crivello salt, is converted into an acid through absorption of incident radiation, such as visible light, near ultraviolet light (NUV), deep ultraviolet light (DUV), X-ray radiation, electron-beam radiation and ion-beam radiation. In the case of positively working, wet-developable resists, in some instances after a baking process, this acid increases the solubility of the irradiated regions in a developer (c.f.: L. F. Thompson et al., loc. cit., pp. 88–90 and 113–115). On the other hand, in the case of negatively working, wet-developable resists, for example, so-called "image reversal" resists, an acid-catalyzed cross-linking takes place in the irradiated regions, through which means the solubility in the developer is reduced (c.f.: "Proc. SPIE", vol. 1086 (1989), pp. 117 128).

When working with dry-developable resist systems, a silylation of the resist layer is carried out at the surface using suitable gaseous or liquid silicon-containing agents, and, in fact, when working with positively working resists, selectively in the unexposed regions and, when working with negatively working resists, selectively in the exposed regions. The development takes place in this case in an anisotropic, oxygen-containing plasma, the silylated regions serving at the surface of the resist layer as a resistant etching mask (c.f.: "Encycl. Polym. Sci. Eng.", vol. 9 (1987), p. 132). A high resolution capability is achieved both when working with wet-developable as well as with dryodevelopable resist systems through a greatest possible difference in the acid concentration between the exposed and the unexposed regions.

Because of diffraction phenomena, lens defects, etc., an image of a given object pattern (=mask pattern) having a modulation of unexposed regions.

Because of diffraction phenomena, lens defects, etc., an image of a given object pattern (=mask pattern) having a modulation of $M_{object}=1$ is only able to be formed in the image plane with a modulation of $M_{image}<1$, i.e., the value for the optical modulation-transfer function ($MTF_{optic}= M_{image}/M_{object}$) lies clearly under the maximum value of 1, particularly for fine patterns to be imaged (c.f.: L. F. Thompson et al., loc. cit., p. 36; W. M. Moreau, loc. cit., p. 357).

The result is that with an increasingly finer structure dimension, the image of the mask pattern formed in the image plane (=resist plane) becomes less and less sharp. For this reason, the resist layer is, in principle, also always exposed somewhat at those sites that actually should remain unexposed. Therefore, with an increasingly finer structure dimension, the difference in the acid concentration between those regions of the resist layer that are to be irradiated and those that are not to be irradiated becomes less and less. The limit of the resist resolution is then reached when the difference in concentration is too small for there to be a difference in solubility characteristics (or also silylation characteristics) of these two regions, i.e., when—for a given mask pattern—the value for the so-called critical modulation-transfer function of the resist $CMTF_{resist}=(10^{1/\gamma}-1)/(10^{1/\gamma}+1)$ ($\gamma$=contrast) exceeds the value of the optical modulation-transfer function ($MTF_{optic}<CMTF_{resist}$). Therefore, a high contrast is indispensable for a high resolution capability of the resist (c.f., also: W. M. Moteau, loc. cit., pp. 368–371).

Now, the problem is that when conventional resist compositions are used, for example on the basis of novolak polymers and diazo naphthoquinones, or of t-boc-protected polymers and crivello salts, one cannot prevent acid from forming undesirably in those regions which are supposed to remain unexposed per se. The resultant reduced contrast of the resist increases the value for the $CMTF_{resist}$ and, thus, limits its resolution capability for fine patterns.

SUMMARY OF THE INVENTION

The object of the invention is to provide a radiation-sensitive resist composition for fabricating highly resolved relief patterns, which will enable the contrast, i.e., the resolution to be improved.

DETAILED DESCRIPTION OF THE INVENTION

This objective is achieved in accordance with the invention by means of a resist composition having the following components:

a film-forming base polymer;

a radiation-active component that releases an acid when irradiated;

a radiation-sensitive ester-former; and a solvent.

Besides the base polymer and a radiation-active compound (photo-acid former), as well as, if need be, other components—the resist composition according to the invention has a radiation-sensitive ester-former as an essential constituent, i.e., a compound which, together with the acid produced by the radiation-active component, forms an ester. This procedure is based on the following mechanism of action of the ester-former.

The light modulation in the resist plane ($M_{image}$) corresponds more or less to the concentration profile in the latent image of the acid produced from the radiation-active component through absorption of the radiant energy. The radiation-sensitive ester-former absorbs the radiation being used for pattern generation and thereby loses the capacity to form esters. What is decisive when working with the resist composition according to the invention is that the concentration profile of the radiation-sensitive ester-former in the latent image complements the concentration profile of the photo-acid.

Thus, when a radiation-active component and a radiation-sensitive ester-former are irradiated simultaneously, regions are formed in the latent image where both acid as well as ester-former are present. The acid in these regions is esterified and converted into a neutral compound in a spontaneous reaction or in a reaction produced by an afterbake step. This results in an acid concentration profile, which shows an abrupt, i.e., a steep rise precisely below the line edge on the mask, so that a substantially sharper and, thus, higher-contrast image is produced. Therefore, the resist composition according to the invention makes it possible to resolve substantially finer patterns than had previously been possible.

In general, as ester-formers, one can use those compounds which react—spontaneously or after baking—with the acid being produced by the radiation-active component due to exposure to form an ester, and which absorb the radiation used during exposure and are thereby broken down photochemically to form products that can no longer enter into any further esterification reaction; moreover, these products should be hydrophilic, i.e., be soluble in the developer. The ester-former itself—in the same way as the ester—should be hydrophobic, i.e., have a solubility-inhibiting effect, or be insoluble in the developer. In the resist solvent, however, the ester-former should be readily soluble and—with respect to a good storage stability of the resist—should not enter into any reaction with the base polymer, the radiation-active component, and other resist additives.

As ester-formers, one preferably uses diazoketones of the structure

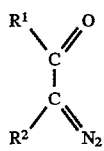

$R^1$ being an aromatic or a saturated or unsaturated—aliphatic, cyclic or heterocyclic hydrocarbon residue, and $R^2$ signifying hydrogen (H) or $R^1$. The hydrocarbon residues can also carry substituents, such as halogens, as well as O-alkyl and nitro-groups.

Suitable diazoketones are, for example, those having substituted alkyl-, cycloalkyl- and aryl residues, as well as those having polycyclic cycloalkyl- and aryl residues and, furthermore, those having polyfunctional residues $R^1$ and $R^2$. The following residues $R^1$ and $R^2$ have proven to be particularly advantageous:

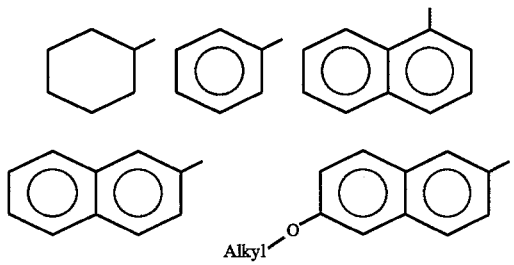

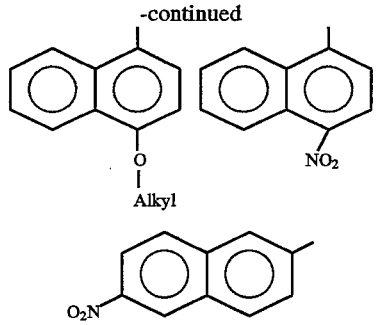

In principle, the residues $R^1$ and $R^2$ are freely selectable. It must be guaranteed, however, when chemically preparing the diazoketones, that compounds are obtained, which are stable at room temperature and, moreover, do not show any significant decomposition at the temperature required to dry the resist on the substrate surface, which is usually between 50° and 130° C. Via the residues $R^1$ and $R^2$, the absorption of the diazoketones can also be advantageously adapted to the radiation used for the exposure and, in addition, by this means the solution properties and the thermal stability can be influenced.

The diazoketones react with the acid (X-H) formed from the radiation-active component while releasing nitrogen, to form a neutral ester:

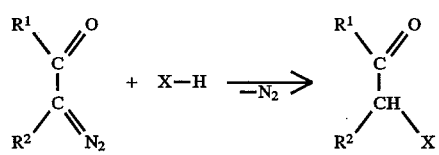

It is unimportant here which acid is formed from the radiation-active component during exposure. What is important, rather, is that this acid reacts with the ester-former to form an ester.

The residue X can, therefore, be both an organic, as well as an inorganic or organometallic residue. Examples of X are: halogen-,

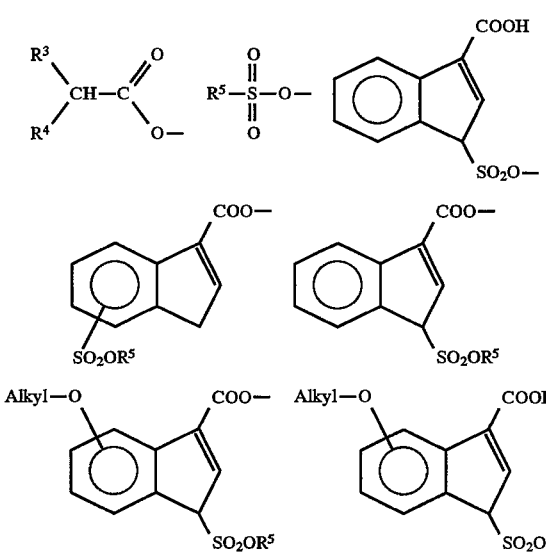

where $R^3$=saturated or unsaturated, aliphatic, cyclic or heterocyclic hydrocarbon residue (if indicated, halogenated), acyl, alkoxy, aryloxy, alkoxycarbonyl or aryloxycarbonyl;

$R^4$=hydrogen, acyl, alkoxy, aryloxy, alkoxycarbonyl, aryloxycarbonyl or halogenated hydrocarbon residue;

$R^5$=saturated or unsaturated, aliphatic, cyclic or heterocyclic hydrocarbon residue (if indicated, halogenated).

The diazoketones of the afore-mentioned type being used as ester-formers are radiation-sensitive compounds. When irradiated, they decompose and form an acid photochemically—in the presence of moisture:

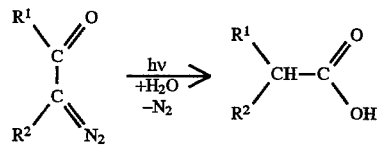

Compounds of this type are relatively weak acids, i.e., they are not able to react with the ester-former, as the acids released from the radiation-active component do. Therefore, it is also not possible for the diazo-compounds to act at the same time as ester-formers and as photo-active components.

The concentration of ester-former in the resist composition is determined, on the one hand, by its effectiveness with respect to the acid released from the radiation-active component and, on the other hand, by the quantity of the radiation-active component applied. Generally, relative to the radiation-active component, 1 to 200 mole-% of radiation-sensitive ester-former are added to the resist; quantities of between 10 and 100 mole-% have proven to be especially advantageous.

Suited as radiation-active components are preferably diazodicarbonyl compounds, diazoquinones, crivello salts and nitrobenzyltosylates. Suitable diazodicarbonyl compounds are, in particular, diazoketo esters and diazo diesters, as well as diazomeldrum acid (2,2-dimethyl-5-diazo-1,3-dioxane-4,6-dione); suited as diazoquinones are, above all, diazo naphthoquinones. Suitable crivello salts are, for example, triflates, i.e., salts of the trifluoromethane sulphonic acid, such as triphenyl sulfoniumtriflate. The radiation-active component is applied in a quantity of 1 to 100% by weight, relatively to the base polymer.

The polymer advantageously contains acid-labile groups, such as epoxy-, terto-butylester- and tert.-butoxycarbonyl groups (t-boc groups); therefore, it is preferably a copolymer or terpolymer with monomer units on the basis of tert.-butoxycarbonyl maleinimide. Other applicable polymers are those on the basis of novolak or cresol novolak, polyvinylphenol and acrylic acid or methacrylic acid. Also suited are styrene-maleinimide copolymers, anhydride-containing polymers and silicon-containing polymers.

The following compounds, in particular, can be used as solvents: ethylene-glycol-monoethyl-ether acetate, propylene-glycol-monomethyl-ether acetate, ethyl lactate, ethyl pyruvate (pyruvic acid ethyl ester), methyl-3-methoxy propionate and cyclohexanone.

The resist composition according to the invention is not restricted to certain resist systems. Rather, many resists systems of the most widely varying kind are able to benefit from the improvement in contrast, such as dry- and wet-developable resists, thermally developable resists, dyed resists, image-reversal resists, multilayer resists and photo-, X-ray, electron-beam, or ion-beam resists. Individual examples are: positively or negatively working, wet-developable single-layer resists, as well as corresponding dry-developable resists, and wet- or dry-developable, positively or negatively working two-layer resists.

When working with so-called acid-catalyzed resists, where a strong acid is released during irradiation, which—during a post-exposure bake step—splits off protective groups, such as t-boc groups, from the base polymer, the resist composition according to the invention offers the further advantage—besides the improvement in contrast—that the acid is prevented from diffusing from the exposed regions of the resist layer into the unexposed regions in the time interval between irradiation and baking (=delay time). In this manner, a stability of the line widths is achieved, and, in fact, independent of the delay time (post exposure delay time stabilization).

The radiation-sensitive resist composition according to the invention is used in lithographic processes to produce highly resolved relief patterns. To this end—to produce a radiation-sensitive resist layer—this resist composition is first applied to an organic or inorganic substrate and subsequently dried. To produce a latent image in the resist layer, it is first irradiated patternwise and, in fact, by means of photo-, X-ray, electron, or ion beams. Finally, the irradiated resist layer is treated with a gaseous or liquid developer to convert the latent image into a relief pattern, and is dried.

To accelerate the ester formation, it is beneficial to subject the resist layer to a bake step following the patternwise exposure ("post exposure bake"). Moreover, following the patternwise exposure or following the bake step, the resist layer can be treated with a silylating agent ("top surface imaging"). Alternatively, a silylation of the resist patterns can take place in that, following the treatment with the developer, i.e., after the drying operation, the resist layer is treated with a silylating agent. In addition, subsequent to the bake step, for purposes of image reversal, the resist layer can still be subjected to a flood exposure, i.e., be irradiated over its entire surface. It should also be mentioned that during the treatment with the developer, either the exposed regions of the resist layer (positive resists) or the unexposed regions (negative resists) can be removed.

One advantageous refinement of the method according to the invention provides that, after the patternwise irradiation or after the bake step, but before a silylation to be carried out in some instances, the resist layer be subjected to a flood exposure using a shorter wavelength than in the case of the patternwise irradiation. This procedure is called for when a photoresist is used and the patternwise irradiation takes place in the NUV (near UV), but the ester-former absorbs in DUV (deep UV). The ester-former is then destroyed, namely, during the flood exposure. The flood exposure takes place, for example, using radiation of a wavelength of 250 nm when the patternwise exposure (in the NUV) is carried out at 365 nm (i-line) or 436 nm (g-line).

The invention will be further elucidated on the basis of exemplary embodiments.

EXAMPLE 1

(Comparative Test)

A resist solution consisting of 1.74 parts by weight of 2.6-dinitrobenzyltosylate (as a radiation-active component), 8.66 parts by weight of a terpolymer of N-tert.-butoxycarbonyl maleinimide, maleic anhydride and styrene (for preparation, see EP Patent Application 0 492 253) and 89.6 parts by weight of propylene glycol monomethylether-acetate is spin-coated on to a silicon wafer. After drying on a hot plate (90° C./60 s), a resist layer with a thickness of 352 run is obtained. This layer is exposed polychromatically through a multidensity mask in the contact mode (device MJB 3, firm Karl Süss; Hg-Xe lamp). The resist layer is subsequently baked at 110° C./60 s on a hot plate, developed for 120 s in the commercial developer NMD-W 2.38% (firm Tokyo Ohka Kogyo Co.), rinsed with water, and dried on a hot plate for 60 s at 90° C. The evaluation of the characteristic curve yields a contrast of 1.9 and a sensitivity of 22.8 mJ/cm$^2$.

EXAMPLE 2

A resist solution consisting of 1.61 parts by weight of 2.6-dinitrobenzyltosylate, 8.06 parts by weight of a terpolymer of N-tert.-butoxycarbonyl maleinimide, maleic anhydride and styrene, 0.81 parts by weight of (diazomethyl-2-naphthyl)-ketone (as a radiation-sensitive ester-former) and 89.6 parts by weight of propylene glycol monomethyletheracetate is spin-coated on to a silicon wafer. After drying on a hot plate (90° C./60 s), a resist layer with a thickness of 344 nm is obtained. This layer is exposed polychromatically through a multidensity mask in the contact mode (device MJB 3, firm Karl Süss; Hg-Xe lamp). The resist layer is subsequently baked at 110° C./60 s on a hot plate, developed for 120 s in the commercial developer NMD-W 2.38% (firm Tokyo Ohka Kogyo Co.), rinsed with water, and dried on a hot plate for 60 s at 90° C. The evaluation of the characteristic curve yields a contrast of −14.5 and a sensitivity of 31.7 mJ/cm$^2$.

EXAMPLE 3

A resist solution consisting of 1.81 parts by weight of 2.6-dinitrobenzyltosylate, 8.06 parts by weight of a terpolymer of N-tert.-butoxycarbonyl maleinimide, maleic anhydride and styfete, 0.61 parts by weight of ω-diazoacetophenone (as a radiation-sensitive ester-former) and 89.6 parts by weight of propylene glycol monomethyletheracetate is spin-coated on to a silicon wafer. After drying on a hot plate (70° C./60 s), a resist layer with a thickness of 361 nm is obtained. This layer is exposed polychromatically through a multidensity mask in the contact mode (device MJB 3, firm Karl Süss; Hg-Xe lamp). The resist layer is subsequently baked at 110° C./60 s on a hot plate, developed for 120 s in the commercial developer NMD-W 2.38% (firm Tokyo Ohka Kogyo Co.), rinsed with water, and dried on a hot plate for 60 s at 90° C. The evaluation of the characteristic curve yields a contrast of −11.7 and a sensitivity of 28.6 mJ/cm$^2$.

EXAMPLE 4

(Comparative Test)

A resist solution consisting of 2.21 parts by weight of diphenyl iodoniumtriflate (as a radiation-active component), 16.3 parts by weight of a copolymer of N-tert.-butoxycarbonyl maleinimide and styrene (preparation analogous to EP Patent Application 0 492 253; see also EP Patent Application 0 492 254, as well as European Patent Application 0 234 327), and 81.5 parts by weight of ethylene glycol monoethyletheracetate is spin-coated on to a silicon wafer. After drying on a hot plate (90° C./60 s), a resist layer with a thickness of 1.2 μm is obtained. This layer is exposed monochromatically, using a 250 nm filter, through a multidensity mask in the contact mode (device MJB 3, firm Karl Süss; Hg-Xe lamp). The resist layer is subsequently baked at 110° C./60 s on a hot plate, developed for 180 s in the commercial developer NMD-W 2.38% (firm Tokyo Ohka Kogyo Co.), rinsed with water, and dried on a hot plate for 60 s at 90° C. The evaluation of the characteristic curve yields a contrast of −1.6 and a sensitivity of 5.7 mJ/c$^2$.

EXAMPLE 5

A resist solution consisting of 2.19 parts by weight of diphenyl iodoniumtriflate, 16.2 parts by weight of a copolymer of N-tert.-butoxycarbonyl maleinimide and styrene, 0.49 parts by weight of (diazomethyl-1-naphthyl)-ketone (as a radiation-sensitive ester-former) and 81.1 parts by weight of ethylene glycol monoethyletheracetate is spin-coated on to a silicon wafer. After drying on a hot plate (90° C./60 s), a resist layer with a thickness of 1.2 μm is obtained. This layer is exposed monochromatically, using a 250 nm filter, through a multidensity mask in the contact mode (device MJB 3, firm Karl Süss; Hg-Xe lamp). The resist layer is subsequently baked at 110° C./60 s on a hot plate, developed for 180 s in the commercial developer NMD-W 2.38% (firm Tokyo Ohka Kogyo Co.), rinsed with water, and dried on a hot plate for 60 s at 90° C. The evaluation of the characteristic curve yields a contrast of −10.3 and a sensitivity of 7.6 mJ/c$^2$.

In comparison to Example 4, Example 5 clearly shows that when working with the resist composition according to the invention, a considerable improvement in contrast is also to be achieved even in the case of thick photoresist layers.

EXAMPLE 6

(Comparative Test)

A resist solution consisting of 2.21 parts by weight of diphenyl iodoniumtriflate, 16.3 parts by weight of a terpolymer of N-tert.-butoxycarbonyl maleinimide, maleic anhydride and styrene, and 81.5 parts by weight of propylene glycol monomethyletheracetate is spin-coated on to a silicon wafer. After drying on a hot plate (90° C./60 s), a resist layer with a thickness of 1.0 μm is obtained. This layer is exposed on a KrF excimer-laser projection exposure device (λ=248 nm; numerical aperture =0.37) through a mask having structures of between 2.0 and 0.25 μm with a dose of 28.5 mJ/c$^2$. The resist layer is subsequently baked at 110° C./60 s on a hot plate, developed for 180 s in the commercial developer NMD-W 2.38% (firm Tokyo Ohka Kogyo Co.), rinsed with water, and dried on a hot plate for 60 s at 90° C. The evaluation of the patterns in the scanning electron microscope reveals a resolution of 2.0 to 0.7 μm structures having sidewall angles of between 80° (2.0 μm structures) and 30° (0.7 μm structures). In the case of the 0.7 μm structures, 50% of the original layer thickness is still present.

EXAMPLE 7

A resist solution consisting of 2.19 parts by weight of diphenyl iodoniumtriflate, 16.2 parts by weight of a terpolymer of N-tert.-butoxycarbonyl maleinimide, maleic anhydride and styrene, 0.49 parts by weight of (diazomethyl-1-naphthyl)-ketone and 81.1 parts by weight of propylene glycol monomethyletheracetate is spin-coated on to a silicon wafer. After drying on a hot plate (90° C./60 s), a resist layer with a thickness of 1.0 μm is obtained. This layer is exposed on a KrF excimer-laser projection exposure device (λ=248 nm; numerical aperture=0.37) through a mask having structures of between 2.0 and 0.25 μm with a dose of 45.2 mJ/cm$^2$. The resist layer is subsequently baked at 110° C./60 s on a hot plate, developed for 180 s in the commercial developer NMD-W 2.38% (firm Tokyo Ohka Kogyo Co.), rinsed with water, and dried on a hot plate for 60 s at 90° C.

The evaluation of the patterns in the scanning electron microscope reveals a resolution of 2.0 to 0.6 µm structures having sidewall angles of between 89° (2.0 µm structures) and 85° (0.6 µm structures). In the case of all the structures, the original layer thickness is still present.

In comparison to Example 6, Example 7 clearly shows that when working with the resist composition according to the invention, both the resolution capability, as well as the structure quality can be substantially improved.

What is claimed is:

1. A radiation-sensitive resist composition for manufacturing highly resolved relief structures, comprising:

a film-forming base polymer;

a radiation-active component that releases an acid when irradiated;

a solvent; and a radiation-sensitive ester-former comprising a diazoketone of the following structure:

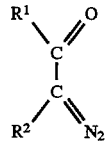

wherein $R^1$ is an aliphatic, aromatic, cyclic or heterocyclic hydrocarbon residue, and $R^2$ is hydrogen (H) or $R^1$.

2. The resist composition according to claim 1, wherein the concentration of the radiation-sensitive ester-former relative to the radiation-active component is about 1 to 200 mole percent.

3. The resist composition according to claim 1, wherein the radiation-active component is selected from the group comprising a diazodicarbonyl compound, a diazoquinone, a crivello salt, and a nitrobenzyltosylate.

4. The resist composition according to claim 1, wherein the base polymer contains acid-labile groups.

5. The resist composition according to claim 1, wherein the base polymer comprises a copolymer or terpolymer with basic units derived from tert.-butoxycarbonyl maleinimide.

6. A method for manufacturing highly resolved relief structures, comprising:

(a) applying to a substrate a radiation-sensitive resist composition according to claim 1;

(b) drying the resist composition such that a radiation-sensitive resist layer is formed;

(c) patternwise irradiating the resist layer such that a latent image is produced in the resist layer;

(d) treating the irradiated resist layer with a developer; and (e) drying the treated resist layer, wherein the latent image is converted into a relief pattern.

7. The method according to claim 6, wherein after step (c), the resist layer is baked.

8. The method according to claim 6, wherein after step (c), the resist layer is treated with a silylating agent.

9. The method according to claim 7, wherein after baking, the resist layer is treated with a silylating agent.

10. The method according to claim 6, wherein after step (e), the resist layer is treated with a silylating agent.

11. The method according to claim 6, wherein after step (c), the resist layer is subjected to a flood exposure with a radiation of a shorter wavelength than in step (c).

12. The method according to claim 7, wherein after baking, the resist layer is subjected to a flood exposure with a radiation of a shorter wavelength than in step (c).

* * * * *